United States Patent
Naum et al.

(10) Patent No.: US 7,135,129 B2
(45) Date of Patent: Nov. 14, 2006

(54) INORGANIC FLUORESCENT MATERIAL USED FOR SOLID-STATE LIGHT SOURCE

(75) Inventors: Soshchin Naum, Taipei (TW); Vishnyakov Anatoly, Taipei (TW); Wei-Hung Lo, Taipei (TW); Chi-Neng Tsai, Taipei (TW)

(73) Assignee: Yano Tech (Shanghai) Limited, Shanghai (CN)

( * ) Notice: Subject to any disclaimer, the term of this patent is extended or adjusted under 35 U.S.C. 154(b) by 249 days.

(21) Appl. No.: 10/689,584

(22) Filed: Oct. 22, 2003

(65) Prior Publication Data

US 2005/0088077 A1    Apr. 28, 2005

(51) Int. Cl.
*C09K 11/08* (2006.01)
*H01J 1/62* (2006.01)

(52) U.S. Cl. .............. 252/301.4 R; 313/503; 313/502; 313/498

(58) Field of Classification Search ........ 313/503; 252/301.4, 301.4 P, 301.4 R
See application file for complete search history.

(56) References Cited

U.S. PATENT DOCUMENTS 5,998,925 A    12/1999    Shimizu et al. ............. 313/503

*Primary Examiner*—Nimeshkumar D. Patel
*Assistant Examiner*—Natalie K Walford
(74) *Attorney, Agent, or Firm*—Troxell Law Office, PLLC

(57) ABSTRACT

An inorganic fluorescent material for solid-state light source is associated with a GaInN heterojunction blue solid-state light source to form a white light source. The fluorescent material is represented by the general formula of $(Y_{1-x-y-z-q}, Gd_x, Dy_y, Yb_z, Er_q, Ce_p)_\alpha (Al_{1-n-m-k}, Ga_n, Sc_k, In_l)_\beta O_{12}$, wherein $\alpha$ is in the range of 2.97–3.02, $\beta$ is in the range of 4.98–5.02, x is in the range of 0.2–0.65, y is in the range of 0.001–0.05, z is in the range of 0.01–0.05, q is in the range of 0.001–0.05, p is in the range of 0.015–0.1, k is in the range of 0.01–0.6, n is in the range of 0.01–0.45, and l is in the range of 0.01–0.1. The short-wavelength light emitted from the GaInN heterojunction blue solid-state light source is mixed with a wide-bandwidth light emitted from the fluorescent material to generate a mixed light of a wavelength of about 535 nm–590 nm.

12 Claims, No Drawings

INORGANIC FLUORESCENT MATERIAL USED FOR SOLID-STATE LIGHT SOURCE

BACKGROUND OF THE INVENTION

1. Field of the Invention

The invention generally relates to an inorganic fluorescent material used for a solid-state light source, and more particularly to an inorganic fluorescent material containing a phosphor that generates a yellow fluorescent light after being excited by a blue solid-state light source so as to generate a white mixed light.

2. Description of the Related Art

Recently, the process of producing a solid-state light source has been continuously developed with increasingly higher illumination efficiency. Since it emits a light wavelength close to monochromic light and has many advantages such as high reliability, long service life and a wide range of application, the solid-state light source has increasingly replaced the traditional vacuum bulb in illumination equipment.

In the prior art, generating white light by means of the solid-state light source includes two methods. One of them mixes red, green and blue lights respectively emitted from their light source to generate white light. This method is called a RGB method. In this method, the mixed light color is not uniform due to cell orientation in the solid-state light source. Furthermore, the illumination intensity is not completely utilized. In the second method, a phosphor layer is applied on the blue solid-state light source, the phosphor layer emitting yellow fluorescent light after being excited by blue light for obtaining white light of a color temperature of about 8000K. U.S. Pat. No. 5,998,925 ("the '925 patent") discloses a light emitting device consisting of a nitride semiconductor and a phosphor containing a garnet fluorescent material, which operates according to the second method. In the '925 patent, a solid-state light source chip is mounted in a casing with a recess or an inwardly bent portion therein, and then a resin coat containing the phosphor fills up the recess or the inwardly bent portion of the casing. The material for a solid-state light source chip includes $In_iGa_jAl_kN$ (i+j+k=1) nitride. The phosphor includes (a) at least one element selected from Y·Lu·Se·La·Gd and Sm, and (b) at lease one element selected from Al·Ga and In; the phosphor is activated by Ce. More specifically, the phosphor includes the general formula of $(Y_{1-p-q-r}, Gd_pCe_qSm_r)_3(Al_{1-s}Ga_s)_5O_{12}$, wherein $1\square p \square 0.8$, $0.003 \square q \square 0.2$, $0.0003 \square r \square 0.08$, and $0 \square s \square 1$, to obtain the light of required wavelength with improved luminance efficiency.

SUMMARY OF THE INVENTION

It is therefore an object of the invention to provide an inorganic phosphor used for a solid-state light source, in which blue light is converted to white light.

It is another object of the invention to provide a process of compounding the inorganic fluorescent material, in which the fluorescent material powders are used for the white solid-state light source.

Furthermore, it is another object of the invention to provide a light emitting device, in which an inorganic fluorescent material uses a blue solid-state light source to generate white light.

According one aspect of the invention, the fluorescent material is represented by the general formula $(Y_{1-x-y-z-q}, Gd_x, Dy_y, Yb_z, Er_q, Ce_p)_\alpha(Al_{1-n-m-k}, Ga_n, Sc_k, In_l)_\beta O_{12}$, wherein α is in the range of about 2.97–3.02, β is in the range of about 4.98–5.02, x is in the range of about 0.2–0.65, y is in the range of about 0.001–0.05, z is in the range of about 0.01–0.05, q is in the range of about 0.001–0.05, p is in the range of about 0.015–0.1, k is in the range of about 0.01–0.6, n is in the range of about 0.01–0.45, and l is in the range of about 0.01–0.1. The fluorescent material is used in association with a GaN heterojunction blue solid-state light source to generate a white solid-state light source. The lights, emitted from the fluorescent material and the GaN heterojunction blue solid-state light source, mix with one another to generate white solid-state light of a wavelength of about 535 nm–590 nm. When the color index is in the range of about 65 to 95, the generated white light is a uniform, with a color temperature of about 3000K to 16000K.

According to another aspect of the invention, the process of compounding the fluorescent material includes: (a) preheating oxides of Gd, Y, Ce, Dy, Er, Yb, Al and Ga and nitrate hydride to about 80–90° C.; (b) reacting the compounds of (a) with high-concentration $NH_4$ to form an intermediate product consisting of hydroxides; (c) rinsing the intermediate product to remove $NO_3$— ions; (d) performing heat treatment in a weak reduction gas environment in three stages, wherein the first heat treatment stage is performed for 1–3 hours at 500K, the second is performed for 1–3 hours at 900–110K and the third is performed for 3 hours at 1400–1700K; and (e) cooling to 400K and graining the product obtained in (d).

According to further another aspects of the invention, the light emitting device includes a base, one or more light emitting devices mounted on the base, a lens and a fluorescent material. The light emitting device emits blue light of a wavelength of about 430 nm to 470 nm. The fluorescent material consists of inorganic phosphor powders associated with a binder, and fills in a chamber defined between the lens and the light emitting device. The distance between walls of the chamber and a p–n junction emitting surface of the light emitting device is equal to that between the walls of the chamber and a periphery of the light emitting device. A plane of the chamber supporting a geometric symmetric axis thereof is perpendicular to the p–n junction emitting surface of the light emitting device.

To provide a further understanding of the invention, the following detailed description illustrates embodiments and examples of the invention, this detailed description being provided only for illustration of the invention.

DETAILED DESCRIPTION OF THE EMBODIMENTS

Wherever possible in the following description, like reference numerals will refer to like elements and parts unless otherwise illustrated.

In one preferred embodiment of the invention, the white light emitting device includes a base, one or more light emitting devices mounted on the base, a lens and a fluorescent material that can convert blue light to white light. The light emitting device can be of different types of construction, such as a lead type or chip type. Regardless of the type of construction, the base having a recess or a slot for receiving the light emitting device is a principal element. The light emitting device emits a solid-state source light of blue color of a wavelength between about 430 nm to 470 nm. The light emitting device can be, for example, GaN, GaInN or AlGaInN semiconductor chips. In practice, the amount of light emitting devices used is determined according to the luminance. The lens is mounted on the recess or the slot so as to define a chamber between the lens and the light emitting device. The distance between walls of the chamber and a p–n junction emitting surface of the light emitting device is equal to that between the walls of the chamber and a periphery of the light emitting device. A plane of the chamber supporting a geometric symmetry axis thereof is perpendicular to the p–n junction emitting surface of the light emitting device. The fluorescent material is formed of inorganic phosphor powders associated with a binder, and fills in the chamber between the lens and the light emitting device. The fluorescent material is mixed with a resin or other gel materials and then molded in the chamber. Preferably, the fluorescent material has a mass thickness in the range of 1–50 mg/cm$^2$.

The fluorescent material absorbs a portion of the light emitted from the light emitting device, and by excitation emits lights of different wavelengths. The lights emitted from the fluorescent material are respectively of a dominant wavelength and a secondary wavelength. The dominant wavelength is preferably 1.2 to 1.4 times the light emitted from the light emitting device. The secondary wavelength is preferably 1.5–1.8 times the light emitted from the light emitting device. Furthermore, the ratio of the mean particle diameter of the inorganic phosphor material powders contained in the fluorescent material to the main wavelength of the light emitted from the light emitting device is preferably in the range of 1:1–10:1.

According to the invention, the fluorescent material that converts blue light to white light includes oxides of rare earth metal elements such as Ga and Al. Specifically, ions of the group consisting of Dy, Yb and Er are added in cationic cells. Oxides of Al, Ga, Sc and In are added in anionic cells. The anionic cells and cationic cells combine to form a compound represented by the following general formula $(Y_{1-x-y-z-q}, Gd_x, Dy_y, Yb_z, Er_q, Ce_p)_\alpha(Al_{1-n-m-k}, Ga_n, Sc_k, In_l)_\beta O_{12}$, wherein $\beta$ is in the range of 2.97–3.02, $\beta$ is in the range of 4.98–5.02, x is in the range of 0.2–0.65, y is in the range of 0.001–0.05, z is in the range of 0.01–0.05, q is in the range of 0.001–0.05, p is in the range of 0.015–0.1, k is in the range of 0.01–0.6, n is in the range of 0.01–0.45, and l is in the range of 0.01–0.1.

When the fluorescent material is used associated with a GaN heterojunction blue solid-state light source, the short-wavelength light from the blue solid-state light source is mixed with the wide-bandwidth light to generate a mixed light of wavelength λ of about 535 nm to 590 nm. When the color index Ra of the mixed light is in the range of 65–90, the hybrid light is a uniform white light of color temperature T in the range of about 3000K–16000K.

According to the best mode of the invention, within the fluorescent material, the ratio of gram-molecular weights of the oxides $Y_2O_3:Gd_2O_3:Ce_2O_3:Dy_2O_3:Yb_2O_3:Er_2O_3$ in the cationic cells is in the range of about 1.9:0.9:0.15:0.02:0.01: 0.01 to 1.65:1.2:0.055:0.035:0.035:0.025. The ratio of gram-molecular weights of the oxides $Al_2O_3:Ga_2O_3:Sc_2O_3:In_2O_3$ in the anionic cells is in the range of about 2:2.8:0.1:0.1–1: 2:1.8:0.2.

When activated oxides $Ce_2O_3+Dy_2O_3$ and $Yb_2O_3+Er_2O_3$ are mixed at a concentration ratio of 1:0.05–1:1, the basic spectrum appears a peak at 565 nm–575 nm, which is an additional wide bandwidth. This turns the mixed light of cold white color into a warm white light of the color temperature of about 12000K–25000K.

Linearity between the radiation intensity of the fluorescent material and the radiation power exciting the blue light is proportional to the concentration of the oxides of Er and yttrium (Y) added in the fluorescent material. Varying the value of a in the range of 0.75–0.99 increases the radiation power of the blue light emitting device by about ten times, within the range of about 10 mW/mm$^2$–100 mW/mm$^2$. At such a high power, the external quantum efficiency γ by the radiation of the fluorescent material is greater or equal to 0.8.

When the concentration ratio of $Ce_2O_3$ to $Dy_2O_3$ is varied from 100:1 to 100:10, the varying amount of the concentration ratio of $Ce_2O_3$ to $Dy_2O_3$ determines the shift of warm white light from cold white light. The intensity of the secondary peak in the spectrum at 570 nm–580 nm is proportional to the concentration of $Dy_2O_3$ added into the fluorescent material. Furthermore, if the concentration ratio of activated $Ce_2O_3$ to $Er_2O_3$ from 100:1 to 100:10, and the optimal concentration of Ce to be added in the fluorescent material is 0.01–0.03 parts by atoms, then the fluorescent material emits green light. The re-illumination occurs with an association of Stokes shift of 1 nm at 295K to 420K. The external quantum efficiency γ for illumination is 0.75–0.90.

The fluorescent material has a prohibited bandwidth at the wavelength of 440 nm to 470 nm. The accumulated reflection index of the powder layer is about 30% to 10%, which is proportional to the total concentration of oxides of Ce, Dy, Er and yttrium (Y) added in the fluorescent material.

The fluorescent material is in the form of powders. The powders are preferably oval-shaped particles. When the ratio of the mean value and the intermediate value of diameters of the particles is smaller than 1.5, the ratio of the length of the lengthwise axis of the particle to the wavelength where the peak appears is 0.5:1 to 3:1. The fluorescent material powders are mixed in a silicon polymer or an epoxy mixture to form the phosphor composition. Preferably, the mass ratio of the fluorescent material powder to the silicon polymer or epoxy mixture is 5–40%, the phosphor composition obtained includes particles of $1 \times 10^5$ to $1 \times 10^7$ per cubic meter.

In the process of compounding the fluorescent material according to the invention, oxides of Gd, Y, Ce, Dy, Er, Yb, Al and Ga and nitrate hydride are preheated to about 80–90° C. The compounds obtained are reacted with high-concentration $NH_4$ to form an intermediate product consisting of hydroxides. The intermediate product was rinsed to remove $NO_3^-$ ions. A heat treatment is performed in a weak reduction gas environment in three stages. The first heat treatment stage is performed for 1–3 hours at 500K. The second heat treatment is performed for 1–3 hours at 900–110K. The third heat treatment is performed for 3 hours at 1400K–1700K. Then, it is cooled to 400K. Finally, the product obtained is grained into particles with appropriate diameters, as desired. Thereby, the fluorescent material powders of the invention are obtained.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An inorganic fluorescent material for solid-state light source, associated with a GaInN heterojunction blue solid-state light source to form white light source, the fluorescent material comprising:

oxides of rare earth metal elements, Ga and Al, wherein ions of the group consisting of Dy, Yb and Er are added in cationic cells, oxides of Al, Ga, Sc and In are added in anionic cells, the anionic cells and cationic cells combining to form a compound represented by the following general formula:

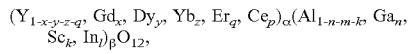

wherein α is in the range of about 2.97–3.02, β is in the range of about 4.98–5.02, x is in the range of about 0.2–0.65, y is in the range of about 0.001–0.05, z is in the range of about 0.01–0.05, q is in the range of about 0.001–0.05, p is in the range of about 0.015–0.1, k is in the range of about 0.01–0.6, n is in the range of about 0.01–0.45, and l is in the range of about 0.01–0.1, the short-wavelength light emitted from the GaInN heterojunction blue solid-state light source being mixed with a wide-bandwidth light emitted from the fluorescent material to generate a mixed light of a wavelength of about 535 nm–590 nm.

2. The inorganic fluorescent material of claim 1, wherein the mixed light has a color index in the range of about 65–90, and is a uniform white light of color temperature of about 3000K–16000K.

3. The inorganic fluorescent material of claim 1, wherein the ratio of gram-molecular weights of the oxides $Y_2O_3$:$Gd_2O_3$:$Ce_2O_3$:$Dy_2O_3$:$Yb_2O_3$:$Er_2O_3$ in the cationic cells is in the range of about 1.9:0.9:0.15:0.02:0.01:0.01 to 1.65: 1.2: 0.055:0.035:0.035:0.025, and the ratio of gram-molecular weights of the oxides $Al_2O_3$:$Ga_2O_3$:$Sc_2O_3$:$In_2O_3$ in the anionic cells is in the range of about 2:2.8:0.1: 0.1–1:2:1.8: 0.2.

4. The inorganic fluorescent material of claim 1, wherein when activated oxides $Ce_2O_3+Dy_2O_3$ and $Yb_2O_3+Er_2O_3$ are mixed at a concentration ratio of about 1:0.05–1:1, the basic spectrum appears a peak at 565 nm–575 nm, which is an additional wide bandwidth, thereby the mixed light of cold white color being turned into a warm white light at a color temperature of about 12000K–25000K.

5. The inorganic fluorescent material of claim 1, wherein linearity between the radiation intensity of the fluorescent material and the radiation power exciting the blue light is proportional to the concentration of the oxides of Er and yttrium (Y) added in the fluorescent material, and varying the value of a in the range of about 0.75–0.99 increases the radiation power of the blue light emitting device by ten times within about 10 mW/mm²–100 mV/mm².

6. The inorganic fluorescent material of claim 1, wherein when the concentration ratio of $Ce_2O_3$ to $Dy_2O_3$ is varied from 100:1 to 100:10, the varying amount of the concentration ratio of $Ce_2O_3$ to $Dy_2O_3$ determines the shift of the warm white light from the cold white light, and the intensity of the secondary peak in the spectrum at about 570 nm–580 nm is proportional to the concentration of $Dy_2O_3$ added into the fluorescent material.

7. The inorganic fluorescent material of claim 1, wherein when the concentration ratio of activated $Ce_2O_3$ to $Er_2O_3$ is about 100:1 to 100:10 and the optimal concentration of Ce to be added in the fluorescent material is 0.01–0.03 parts by atoms, the fluorescent material emits green light.

8. The inorganic fluorescent material of claim 1, wherein re-illumination occurs with the association of a Stokes shift of 100 nm or greater than 100 nm at 295 K to 420K, and the external quantum efficiency γ for illumination is 0.75–0.90.

9. The inorganic fluorescent material of claim 1, wherein the fluorescent material has a prohibited bandwidth at a wavelength of about 440 nm to 470 nm, and the accumulated reflection index of the powder layer is about 30% to 10%, being proportional to the total concentration of oxides of Ce, Dy, Er and yttrium (Y) added in the fluorescent material.

10. The inorganic fluorescent material of claim 1, wherein the ratio of the mean value and the intermediate value of diameters of the particles is smaller than 1.5, the ratio of the length of the lengthwise axis of the particles to the wavelength of the peak is 0.5:1 to 3:1.

11. The inorganic fluorescent material of claim 1, wherein the fluorescent material powders are mixed in a silicon polymer or an epoxy mixture to form the phosphor composition, and when the mass ratio of the fluorescent material powders to the silicon polymer or epoxy mixture is 5–40%, the phosphor composition obtained includes particles of $1\times10^5$ to $1\times10^7$ per cubic meter.

12. A process of compounding the flourescent material represented by the following general formula $Y_{1-x-y-z-g}$, $Gd_x$, $Dy_y$, $Yb_z$, $Er_q$, $Ce_p)\alpha(Al_{1-n-m-m-k}$, $Ga_n$, $Sc_k$, $In_l)\beta O_{12}$, wherein α is in the range of about 2.97—3.02, β is in the range of about 4.98—5.02, x is in the range of about 0.2—0.65, y is in the range of about 0.001—0.05, z is in the range of about 0.01—0.005, q is in the range of about 0.001—0.05, p is in the range of about 0.015—0.1, k is in the range of about 0.01—0.6, n is in the range of about 0.01—0.45, and l is in the range of about 0.01—0.1, the process comprising:
(a) preheating oxides of Gd, Y, Ce, Dy, Er, Yb, Al and Ga and nitrate hydride to about 80—90°C;
(b) reacting the compounds of (a) with high-concentration $NH_4$ to form an intermediate product consisting of hydroxides; (c) rinsing the intermediate product to remove $NO_3^{-1}$ ions; (d) performing a heat treatment in a weak reduction gas environment in three stages, wherein the first heat treatment stage is performed for 1—3 hours at 500K, the second is performed for 1—3 hours at 900—110K and the third is performed for 3 hours at 1400—1700K; and (e) cooling to 400K and graining the product obtained in (d).

* * * * *